(12) United States Patent
Hsieh et al.

(10) Patent No.: US 12,494,459 B2
(45) Date of Patent: Dec. 9, 2025

(54) LIGHT EMITTING DEVICE HAVING A ENCAPSULATION LAYER COVERING A CIRCUIT STRUCTURE AND MANUFACTURING METHOD THEREOF

(71) Applicant: AUO Corporation, Hsinchu (TW)

(72) Inventors: Hao-Lun Hsieh, Hsinchu (TW); Shuo-Yang Sun, Hsinchu (TW); Fu-Yang Chen, Hsinchu (TW); Xiao-Yun Li, Hsinchu (TW); Yu-Hao Chang, Hsinchu (TW); Jhih-Jhu Jhan, Hsinchu (TW)

(73) Assignee: AUO Corporation, Hsinchu (TW)

( * ) Notice: Subject to any disclaimer, the term of this patent is extended or adjusted under 35 U.S.C. 154(b) by 442 days.

(21) Appl. No.: 18/086,675

(22) Filed: Dec. 22, 2022

(65) Prior Publication Data

US 2024/0194652 A1 Jun. 13, 2024

(30) Foreign Application Priority Data

Dec. 7, 2022 (TW) .................................. 111146903

(51) Int. Cl.
| | | |
|---|---|---|
| *H01L 25/075* | (2006.01) | |
| *H10H 20/01* | (2025.01) | |
| *H10H 20/852* | (2025.01) | |
| *H10H 20/855* | (2025.01) | |
| *H10H 20/857* | (2025.01) | |

(52) U.S. Cl.
CPC ......... *H01L 25/0753* (2013.01); *H10H 20/01* (2025.01); *H10H 20/852* (2025.01); *H10H 20/855* (2025.01); *H10H 20/857* (2025.01); *H10H 20/0362* (2025.01); *H10H 20/0364* (2025.01)

(58) Field of Classification Search
CPC ..... H01L 25/0753; H01L 21/56; H10H 20/85; H10H 20/852
USPC ........................................................ 257/88–89
See application file for complete search history.

(56) References Cited

U.S. PATENT DOCUMENTS

| | | |
|---|---|---|
| 9,236,541 B2 | 1/2016 | Huang et al. |
| 9,525,113 B2 | 12/2016 | Huang et al. |
| 2015/0084072 A1 | 3/2015 | Huang et al. |
| 2016/0087168 A1 | 3/2016 | Huang et al. |
| 2020/0365568 A1 | 11/2020 | Jang et al. |
| 2022/0093578 A1* | 3/2022 | Lin ........................ H01L 25/162 |
| 2022/0238496 A1* | 7/2022 | Takeya .................. H10H 20/831 |
| 2023/0178520 A1* | 6/2023 | Lin ........................ H10H 20/018 257/91 |

(Continued)

FOREIGN PATENT DOCUMENTS

| | | |
|---|---|---|
| CN | 210403768 | 4/2020 |
| CN | 111933630 | 11/2020 |

(Continued)

*Primary Examiner* — Ratisha Mehta
*Assistant Examiner* — Mikka Liu
(74) *Attorney, Agent, or Firm* — JCIPRNET

(57) ABSTRACT

A light emitting device includes a light emitting diode package structure. The light emitting diode package structure includes a circuit structure, a plurality of light emitting diodes, and an encapsulation layer. The light emitting diodes are disposed on the circuit structure and electrically connected to the circuit structure. The encapsulation layer covers top surfaces and side surfaces of the light emitting diodes and a side surface of the circuit structure.

16 Claims, 14 Drawing Sheets

(56) References Cited

U.S. PATENT DOCUMENTS

2023/0369229 A1* 11/2023 Lin ...................... H01L 21/486

FOREIGN PATENT DOCUMENTS

| CN | 114613743 | 6/2022 |
| TW | 201513401 | 4/2015 |
| TW | 202129998 | 8/2021 |

* cited by examiner

LIGHT EMITTING DEVICE HAVING A ENCAPSULATION LAYER COVERING A CIRCUIT STRUCTURE AND MANUFACTURING METHOD THEREOF

CROSS-REFERENCE TO RELATED APPLICATION

This application claims the priority benefit of Taiwanese application no. 111146903, filed on Dec. 7, 2022. The entirety of the above-mentioned patent application is hereby incorporated by reference herein and made a part of this specification.

BACKGROUND OF THE INVENTION

Field of the Invention

The invention relates to a light emitting device and a manufacturing method thereof.

Description of Related Art

The light emitting diode is a type of electroluminescent semiconductor element that has advantages such as high efficiency, long life, not prone to damage, fast response speed, and high reliability. With the investment of a lot of time and money, the size of the light emitting diode has been reduced year by year. However, it is still difficult to use the light emitting diode in the pixel structure of a light emitting device, especially in a light emitting device where a single pixel has a red sub pixel, a green sub pixel, and a blue sub pixel. The size of a single sub pixel is very small, and there is an issue of low process yield when manufacturing a light emitting diode conforming to the small sized sub pixel and when transferring the light emitting diode.

SUMMARY OF THE INVENTION

The invention provides a light emitting device and a manufacturing method thereof that may alleviate the issue that the circuit structure in the light emitting diode package structure is readily damaged during the manufacturing process.

At least one embodiment of the invention provides a light emitting device. The light emitting device includes a light emitting diode package structure. The light emitting diode package structure includes a circuit structure, a plurality of light emitting diodes, and an encapsulation layer. The light emitting diodes are disposed on the circuit structure and electrically connected to the circuit structure. The encapsulation layer covers top surfaces and side surfaces of the light emitting diodes and a side surface of the circuit structure.

At least one embodiment of the invention provides a manufacturing method of a light emitting device, including the following steps. A plurality of circuit structures separated from each other and a plurality of light emitting diodes located on the circuit structures are provided on a carrier board. An encapsulation material is formed on the light emitting diodes and the circuit structures, wherein the encapsulation material covers top surfaces and side surfaces of the light emitting diodes and side surfaces of the circuit structures. The encapsulation material is cut along a plurality of cutting lines to form a plurality of encapsulation layers separated from each other, and a plurality of light emitting diode package structures are formed. Each of the light emitting diode package structure includes a corresponding circuit structure, a plurality of corresponding light emitting diodes, and a corresponding encapsulation layer. The cutting lines are located between the circuit structures.

Based on the above, since the cutting lines are located between the circuit structures, it is possible to avoid damage to the circuit structures when cutting the encapsulation material.

DESCRIPTION OF THE EMBODIMENTS

Figure 1A:
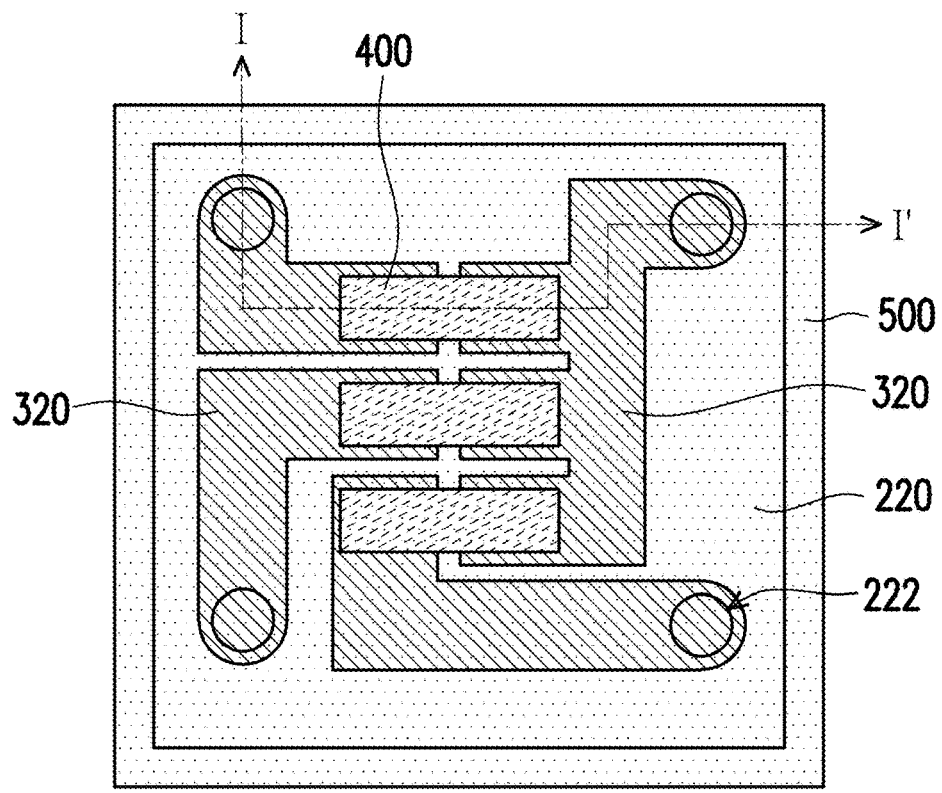
FIG. 1A is a schematic top view of a light emitting diode package structure according to an embodiment of the invention.
Figure 1B:
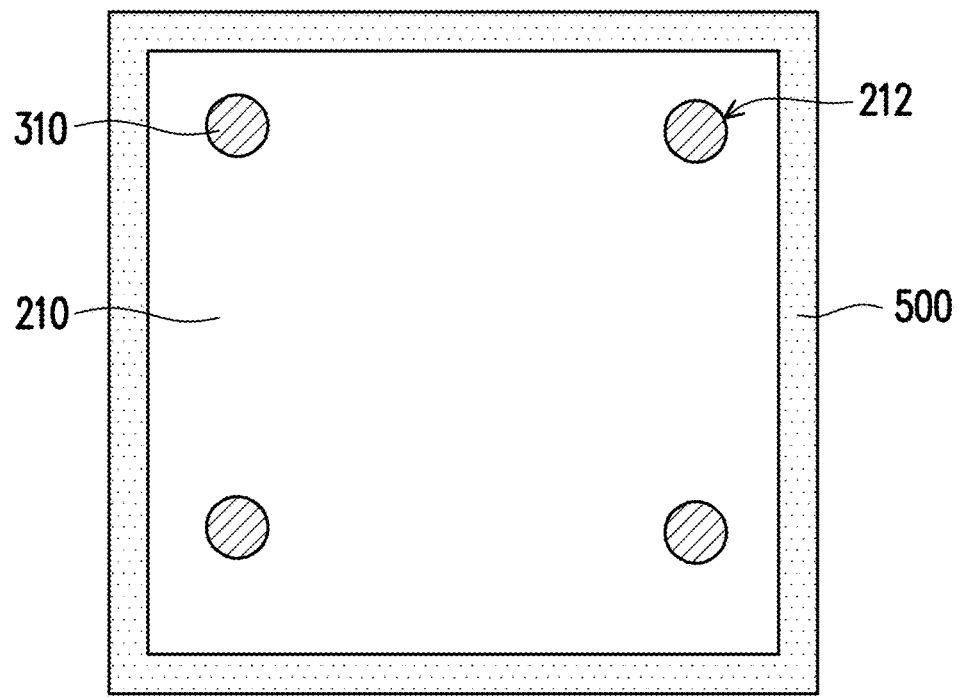
FIG. 1B is a schematic bottom view of the light emitting diode package structure of FIG. 1A.
Figure 1C:
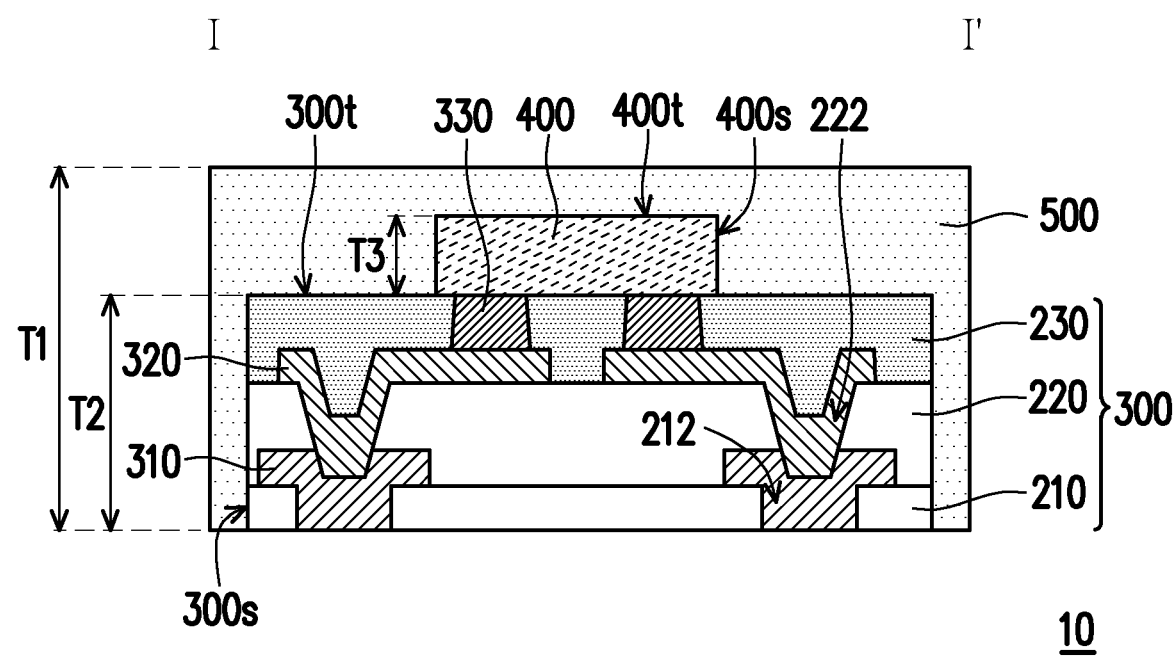
FIG. 1C is a schematic cross-sectional view along line I-I' of FIG. 1A.

FIG. 1A is a schematic top view of a light emitting diode package structure according to an embodiment of the invention. FIG. 1B is a schematic bottom view of the light emitting diode package structure of FIG. 1A. FIG. 1C is a schematic cross-sectional view along line I-I' of FIG. 1A.

Please refer to FIG. 1A to FIG. 1C, a light emitting diode package structure 10 includes a circuit structure 300, a plurality of light emitting diodes 400, and an encapsulation layer 500. For convenience of illustration, the encapsulation layer 500 in FIG. 1A is shown in perspective.

The circuit structure 300 includes a first insulating layer 210, a second insulating layer 220, a light shielding layer 230, a first conductive layer 310, and a second conductive layer 320. For convenience of illustration, the light shielding layer 230 is omitted in FIG. 1A.

The first insulating layer 210 has a plurality of first vias 212. The position and quantity of the first vias 212 may be adjusted according to actual needs.

The first conductive layer 310 is located on the first insulating layer 210 and filled into the first vias 212 of the first insulating layer 210. The first conductive layer 310 includes a plurality of portions separated from each other, and the plurality of portions are respectively filled into the plurality of first vias 212 of the first insulating layer 210. For example, in the present embodiment, the first insulating layer 210 includes four first vias 212, and the first conductive layer 310 includes four portions separated from each other and respectively filled into the first vias 212. In the present embodiment, the bottom most surface of the first conductive layer 310 filled into the first vias 212 is aligned with the bottom surface of the first insulating layer 210.

The second insulating layer 220 is located on the first insulating layer 210 and has a plurality of second vias 222. The position and quantity of the second vias 222 may be adjusted according to actual needs. In the present embodiment, the second vias 222 are overlapped with the first vias 212, but the invention is not limited thereto. In other embodiments, the second vias 222 are not overlapped with the first vias 212.

The second conductive layer 320 is located on the second insulating layer 220 and filled into the second vias 222 of the second insulating layer 220. The second conductive layer 320 includes a plurality of portions separated from each other, and the plurality of portions are respectively filled into the plurality of second vias 222 of the second insulating layer 220. For example, in the present embodiment, the second insulating layer 220 includes four second vias 222, and the second conductive layer 320 includes four portions separated from each other and respectively filled into the second vias 222. In the present embodiment, the second conductive layer 320 filled into the second vias 222 is electrically connected to the first conductive layer 310.

In some embodiments, the material of the first insulating layer 210 and the second insulating layer 220 includes polyimide (PI), silicon nitride (SiNx), silicon oxide (SiOx), or other insulating materials.

In some embodiments, the material of the first conductive layer 310 and the second conductive layer 320 includes metal, metal oxide, metal nitride, or other suitable conductive materials.

The light emitting diodes 400 are disposed on the circuit structure 300 and electrically connected to the circuit structure 300. In the present embodiment, the light emitting diodes 400 are electrically connected to the second conductive layer 320 via a conductive connecting member 330 and electrically connected to the first conductive layer 310 via the second conductive layer 320. In the present embodiment, the light emitting diodes 400 are flip-chip bonded to the circuit structure 300 via the conductive connecting member 330, but the invention is not limited thereto. In other embodiments, the light emitting diodes are vertical light emitting diodes, and after the lower electrode of the light emitting element is bonded to the circuit structure 300, other conductive lines are additionally formed to electrically connect the upper electrode of the light emitting element to the circuit structure 300.

In some embodiments, the conductive connecting member 330 includes metal (such as nickel, gold, bismuth, or an alloy of the metals or a stacked layer of the metals), solder, conductive adhesive, or other suitable conductive materials.

In some embodiments, the plurality of light emitting diodes 400 in a single light emitting diode package structure 10 may include a plurality of light emitting diodes of different colors. Since a single light emitting diode package structure 10 includes the plurality of light emitting diodes 400, transferring one light emitting diode package structure 10 is equivalent to simultaneously transferring the plurality of light emitting diodes 400. In this way, the difficulty of transferring the light emitting diodes 400 is reduced.

The light shielding layer 230 is located on the second insulating layer 220 and surrounds a plurality of contacts between the light emitting diodes 400 and the circuit structure 300 (i.e., the electrodes of the light emitting diodes 400 and/or the conductive connecting member 330). In this way, the plurality of contacts between the light emitting diodes 400 and the circuit structure 300 are protected. In addition, the light shielding layer 230 may alleviate the issue of mutual interference of light emitted by different light emitting diodes 400.

The encapsulation layer 500 covers top surfaces 400t and side surfaces 400s of the light emitting diodes 400 and a side surface 300s of the circuit structure 300. In the present embodiment, the encapsulation layer 500 covers a portion of the top surface 300t of the circuit structure 300. In the present embodiment, the encapsulation layer 500 covers the first insulating layer 210, the second insulating layer 220, the light shielding layer 230, the first conductive layer 310, the second conductive layer 320, and the light emitting diodes 400. The encapsulation layer 500 is in contact with the side surface of the first insulating layer 210, the side surface of the second insulating layer 220, and the side surface of the light shielding layer 230.

In some embodiments, the material of the encapsulation layer 500 includes silicone resin, epoxy resin, or other insulating materials. The silicone resin includes, for example, polydimethylsiloxane (PDMS) or other silicone resins. The epoxy resin includes, for example, diglycidyl ether of bisphenol A (DGEBA) epoxy resin or other epoxy resins.

In some embodiments, the material of the first insulating layer 210 and the second insulating layer 220 is different from the material of the encapsulation layer 500. For example, the first insulating layer 210 and the second insulating layer 220 include a material with high temperature resistance and yellowish color, and the encapsulation layer 500 includes a material with high transmittance, so that the light emitted by the light emitting diodes 400 may pass through the encapsulation layer 500 more readily. In some embodiments, the transmittance of the encapsulation layer 500 is greater than the transmittance of the first insulating layer 210, the transmittance of the second insulating layer 220, and the transmittance of the light shielding layer 230.

In the present embodiment, a thickness T1 of the encapsulation layer 500 is greater than a thickness T2 of the circuit structure 300 plus a thickness T3 of the light emitting diodes 400. The encapsulation layer 500 is extended continuously from the top surface of the light emitting diode package structure 10 to the bottom surface of the light emitting diode package structure 10, and the encapsulation layer 500 covers the side surface 300s of the circuit structure 300. Therefore, when performing the cutting process, only the position of the encapsulation layer 500 needs to be cut, reducing the probability of damage to the circuit structure 300 during the cutting process.

Figure 2A:
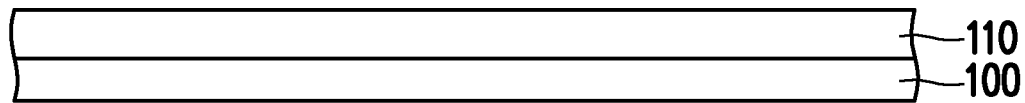
FIG. 2A to FIG. 2Q are schematic cross-sectional views of a manufacturing method of a light emitting device according to an embodiment of the invention.
Figure 2B:
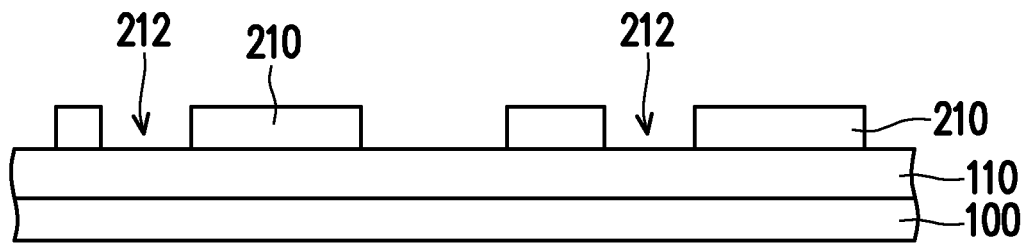
Figure 2C:
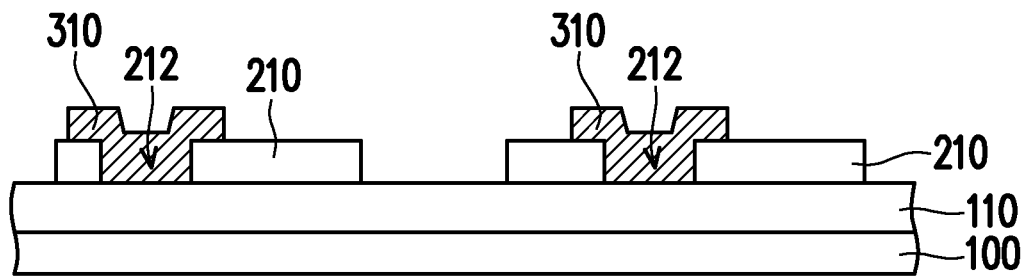
Figure 2D:
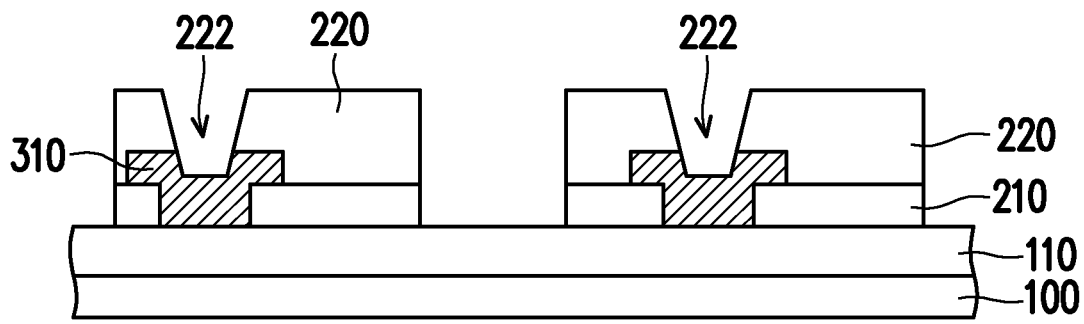
Figure 2E:
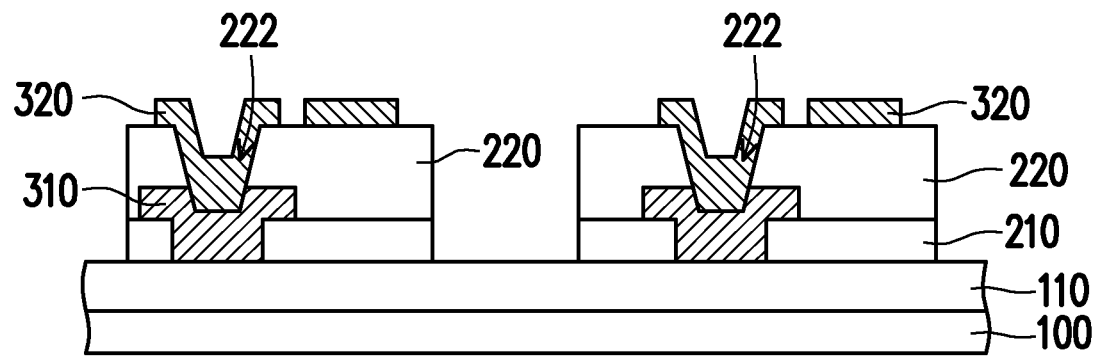
Figure 2F:
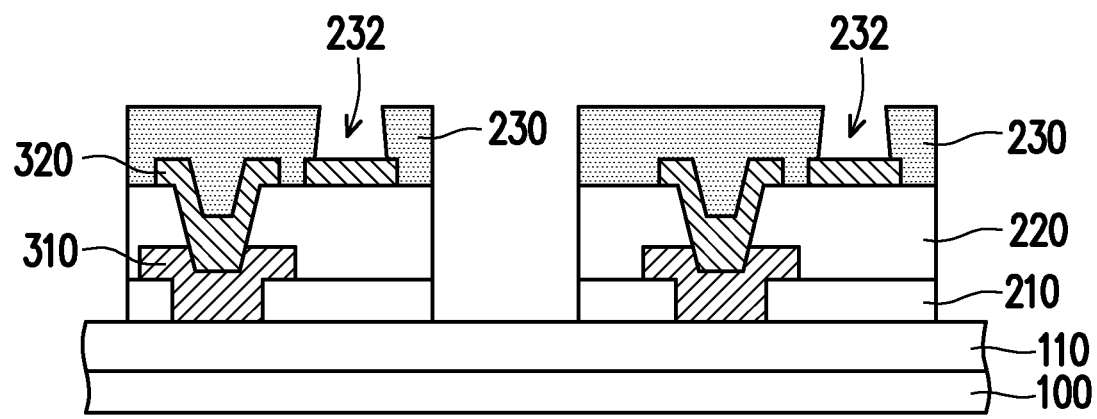
Figure 2G:
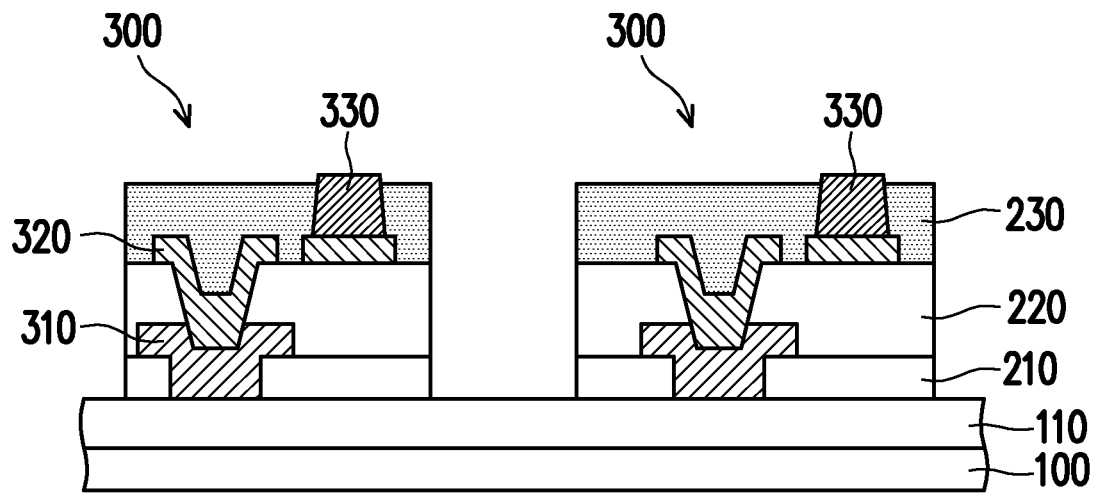
Figure 2H:
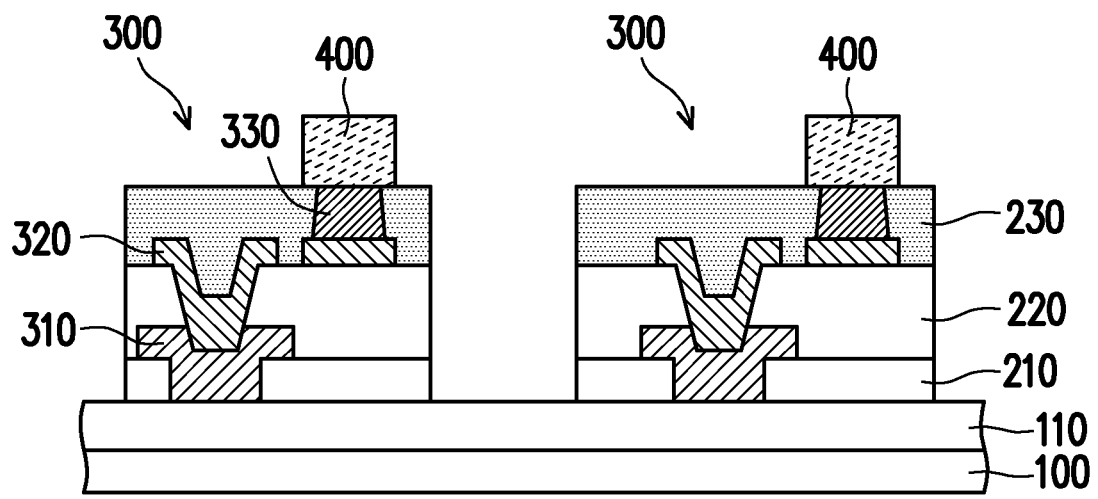
Figure 2I:
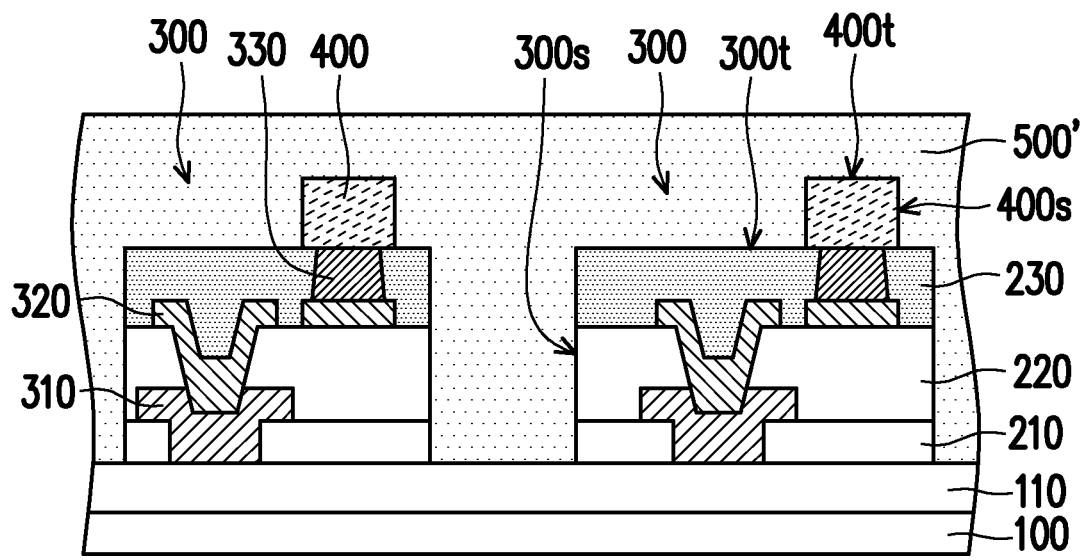
Figure 2J:
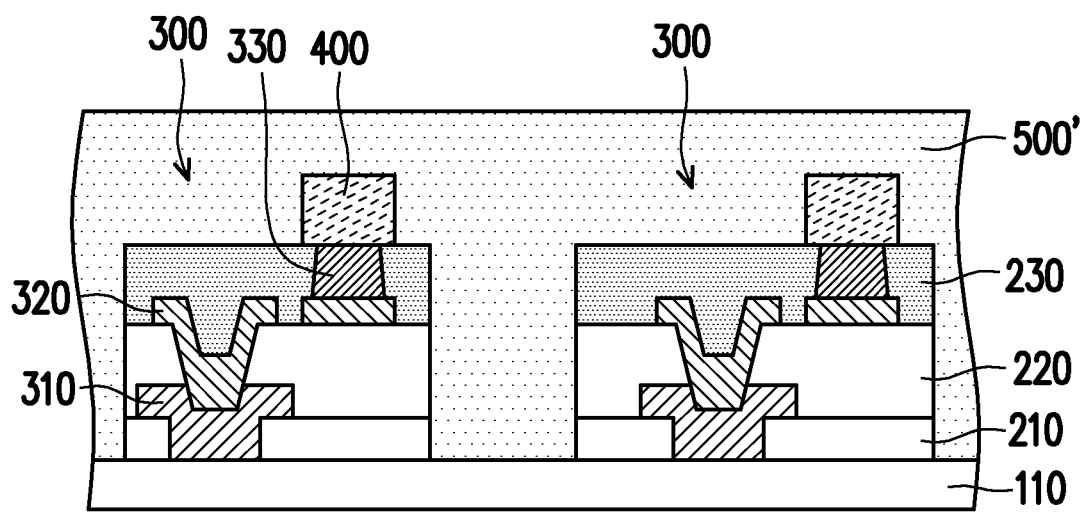
Figure 2K:
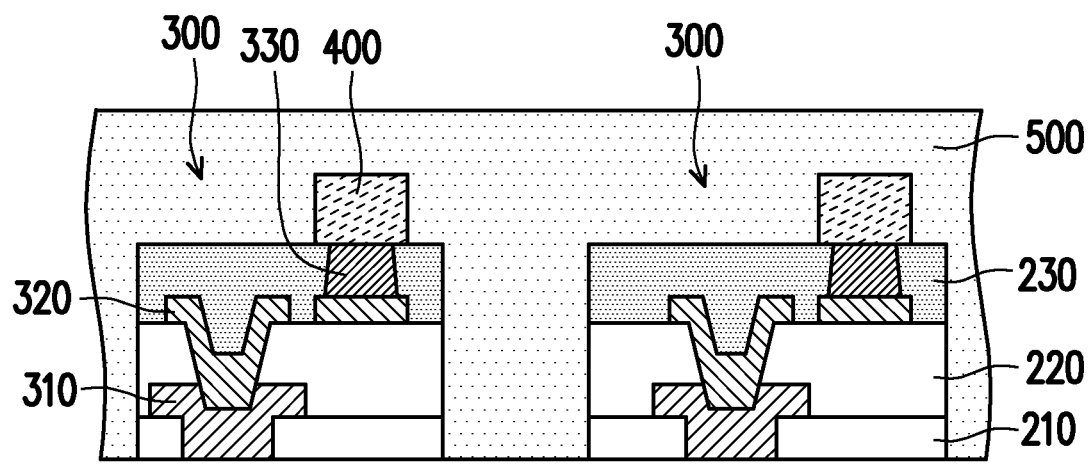
Figure 2L:
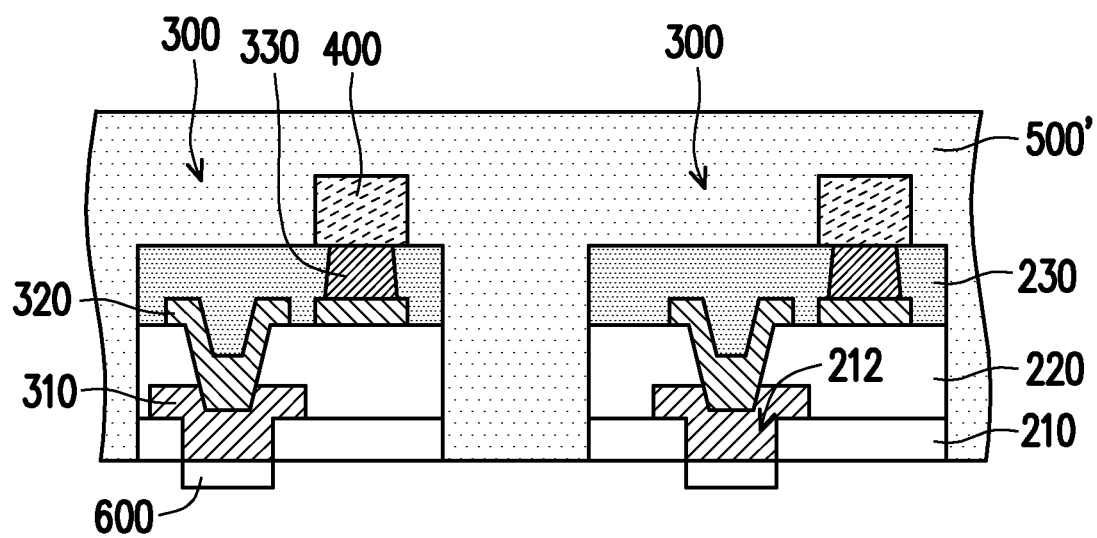
Figure 2M:
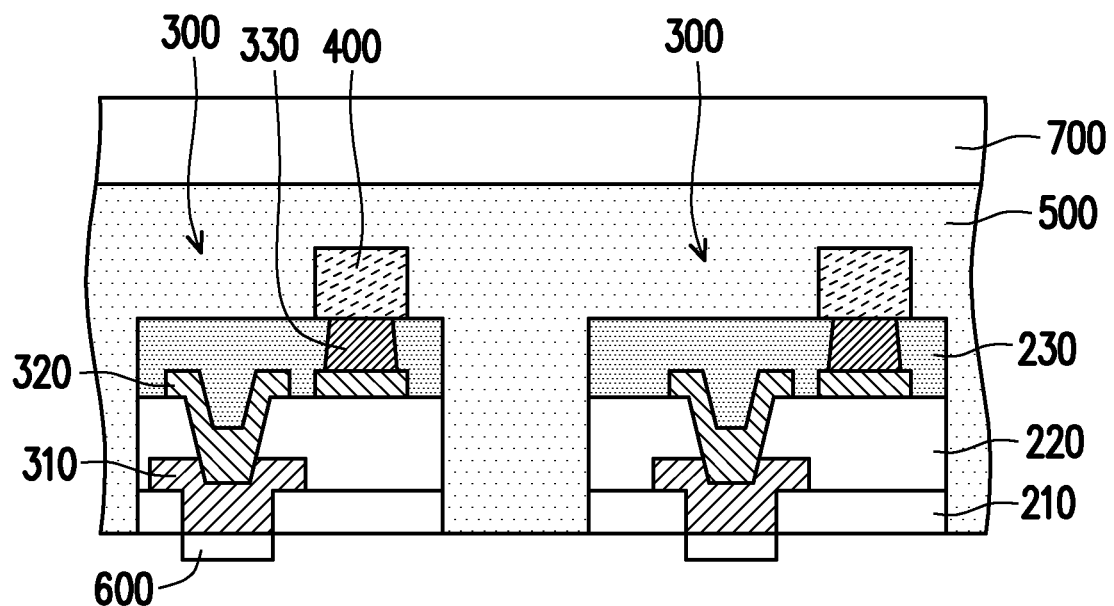
Figure 2N:
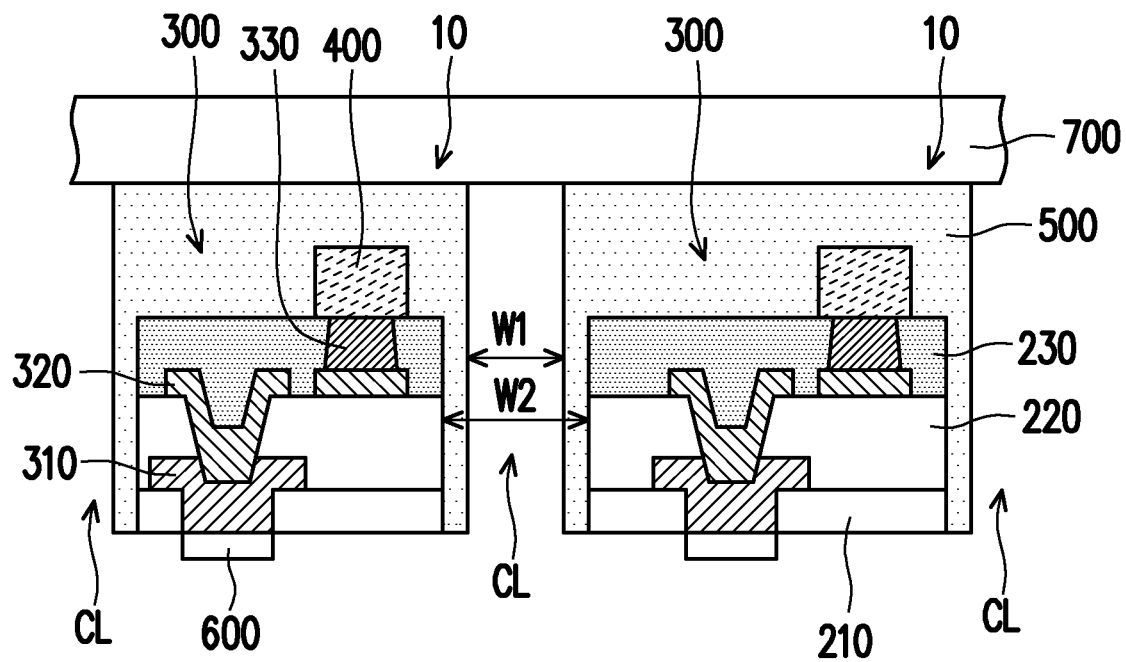
Figure 20:
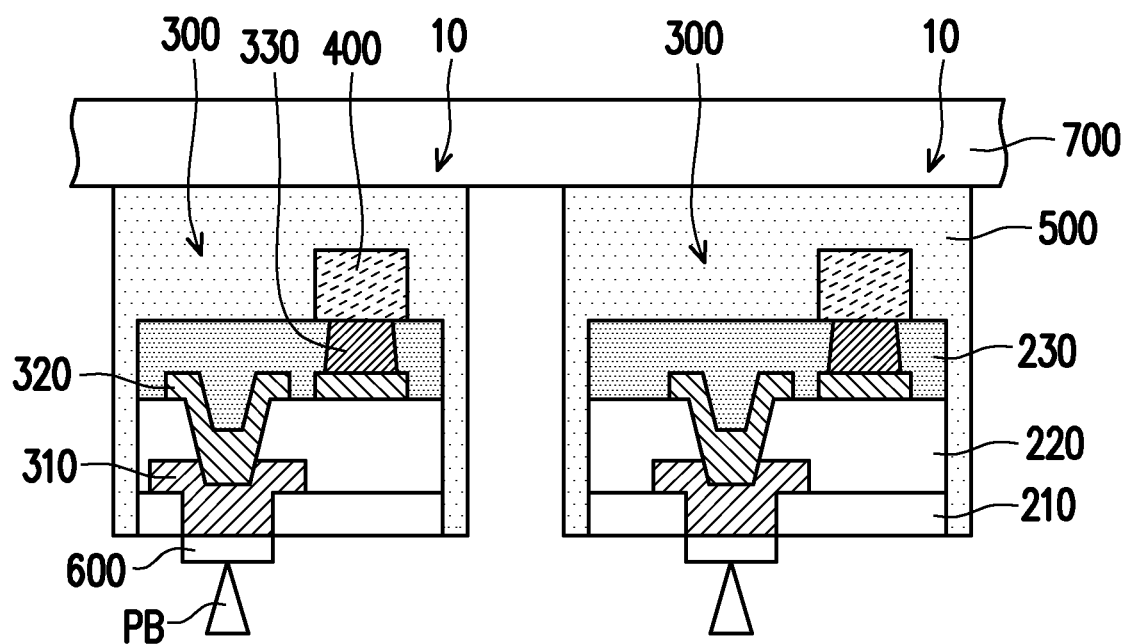
Figure 2P:
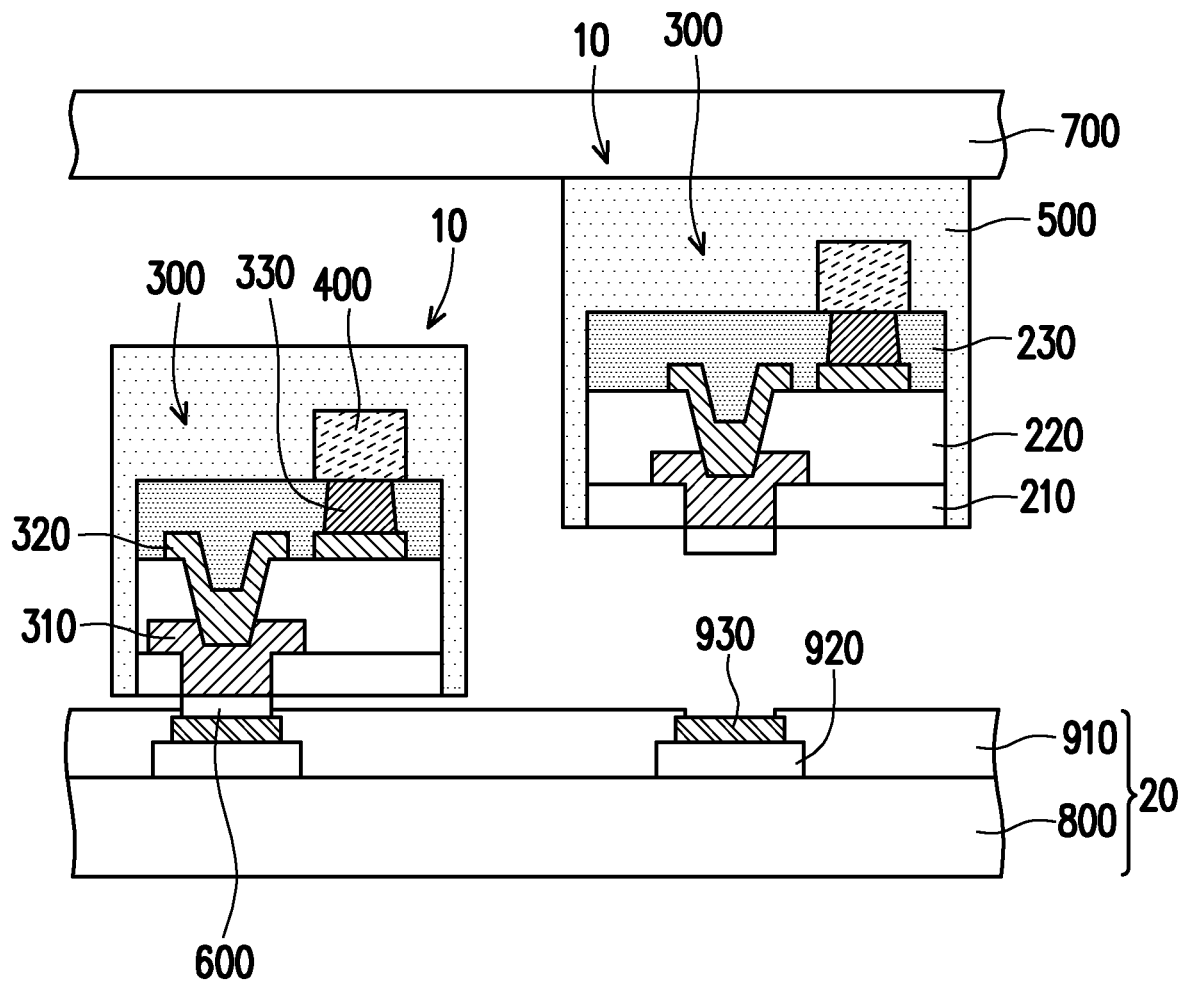
Figure 2Q:
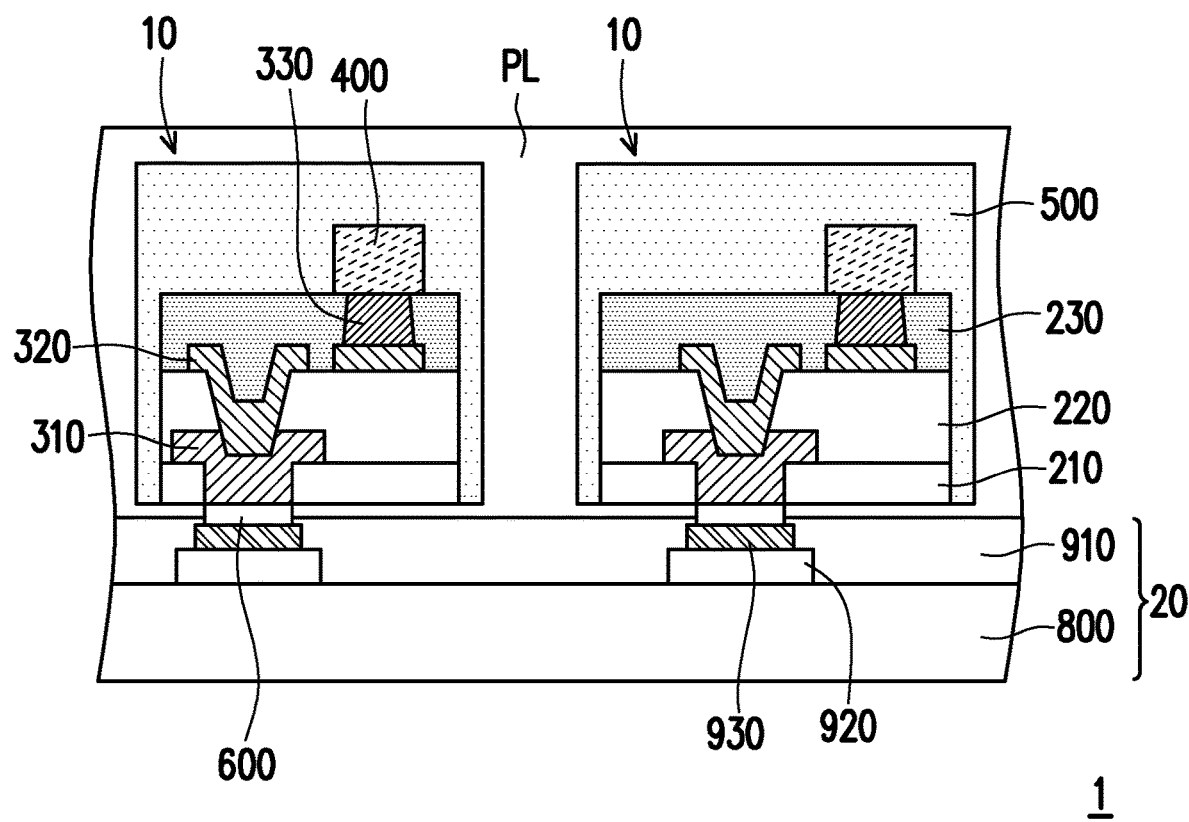

FIG. 2A to FIG. 2Q are schematic cross-sectional views of a manufacturing method of a light emitting device according to an embodiment of the invention. It should be mentioned here that, the embodiment of FIG. 2A to FIG. 2O adopts the reference numerals of the embodiment of FIG. 1A to FIG. 1C and a portion of the content thereof, wherein the same or similar reference numerals are used to represent the same or similar elements and description of the same technical content is omitted. The omitted portions are as described in the above embodiments and are not repeated herein.

Referring to FIG. 2A to FIG. 2H, a plurality of circuit structures 300 separated from each other and the plurality of light emitting diodes 400 located on the circuit structures 300 are provided on a carrier board 100. First, please refer to FIG. 2A, the carrier board 100 is provided, and a release layer 110 is formed on the carrier board 100.

Referring to FIG. 2B, a plurality of first insulating layers 210 separated from each other are formed on the carrier board 100. Each of the first insulating layers 210 includes a plurality of first vias 212 (FIG. 2B only shows one of the first vias 212 of the first insulating layer 210). In the present embodiment, the first insulating layers 210 are formed on the release layer 110. FIG. 2B shows the forming of two first insulating layers 210, but the invention is not limited thereto. The quantity of the first insulating layer 210 may be adjusted according to actual needs.

Referring to FIG. 2C, a plurality of first conductive layers 310 are formed on the first insulating layers 210. Each of the first conductive layers 310 is formed on one corresponding first insulating layer 210. The first conductive layers 310 are filled into the corresponding first vias 212. In some embodiments, each of the first conductive layers 310 includes a plurality of mutually separated portions, and each of the separated portions is filled into one corresponding first via 212.

Referring to FIG. 2D, a plurality of second insulating layers 220 separated from each other are formed on the first insulating layers 210. Each of the second insulating layers 220 is formed on one corresponding first insulating layer 210. Each of the second insulating layers 220 includes a plurality of second vias 222 (FIG. 2D only shows one of the second vias 222 of the second insulating layer 220).

In the present embodiment, the side surfaces of the second insulating layers 220 are aligned with the side surfaces of the first insulating layers 210, but the invention is not limited thereto. In other embodiments, the side surfaces of the second insulating layers 220 are retracted from the side surfaces of the first insulating layers 210. In other embodiments, the second insulating layers 220 are expanded and cover the side surfaces of the first insulating layers 210.

Referring to FIG. 2E, a plurality of second conductive layers 320 are formed on the second insulating layers 220. Each of the second conductive layers 320 is formed on one corresponding second insulating layer 220. The second conductive layers 320 are filled into the corresponding second vias 222. In some embodiments, each of the second conductive layers 320 includes a plurality of mutually separated portions, and each of the separated portions is filled into one corresponding second via 222.

Referring to FIG. 2F, a plurality of light shielding layers 230 separated from each other are formed on the second insulating layers 220. Each of the light shielding layers 230 is formed on one corresponding second insulating layer 220. The light shielding layers 230 have a plurality of third vias 232 (only one of the third vias 232 of the light shielding layers 230 is shown in FIG. 2F). The third vias 232 expose at least a portion of the second conductive layers 320. In the present embodiment, the third vias 232 have a structure with a narrow top and a wide bottom, but the invention is not limited thereto. In other embodiments, the third vias 232 have a structure with a wide top and a narrow bottom, or the third vias 232 have a vertical sidewall.

In the present embodiment, the side surfaces of the light shielding layers 230 are aligned with the side surfaces of the second insulating layers 220, but the invention is not limited thereto. In other embodiments, the side surfaces of the light shielding layers 230 are retracted from the side surfaces of the second insulating layers 220. In other embodiments, the light shielding layers 230 are expanded and cover the side surfaces of the second insulating layer 220.

Referring to FIG. 2G, a plurality of conductive connecting members 330 are formed on the light shielding layers 230. Each of the conductive connecting members 330 is filled into the corresponding third via 232 and electrically connected to the second conductive layers 320.

So far, a plurality of circuit structures 300 separated from each other are formed on the carrier board 100.

Referring to FIG. 2H, the plurality of light emitting diodes 400 are placed on the circuit structures 300. The light emitting diodes 400 are bonded to the second conductive layers 320 via the electrical connecting members 330.

Referring to FIG. 2I, an encapsulation material 500' is formed on the light emitting diodes 400 and the circuit structures 300. The encapsulation material 500' covers the top surfaces 400t and the side surfaces 400s of the light emitting diodes 400 and the top surfaces 300t and the side surfaces 300s of the circuit structures 300. In the present embodiment, the encapsulation material 500' is in contact with the side surfaces of the first insulating layers 210, the side surfaces of the second insulating layers 220, and the side surfaces of the light shielding layers 230.

In some embodiments, the encapsulation material 500' is also filled into the gap (not shown) between the light emitting diodes 400 and the circuit structures 300, thereby further fixing the light emitting diodes 400.

Referring to FIG. 2J, the carrier board 100 is removed.

Referring to FIG. 2K, the release layer 110 is removed. In some embodiments, the method of removing the release layer 110 includes dry etching, wet etching, or other suitable processes.

Referring to FIG. 2L, a connection terminal 600 is formed on a side of the circuit structures 300 opposite to the light emitting diodes 400. In the present embodiment, the connection terminal 600 is formed under the first vias 212 and connected to the first conductive layers 310. In some embodiments, the connection terminal 600 includes metal (such as nickel, gold, bismuth, or an alloy of the metals or a stacked layer of the metals), solder, conductive adhesive, or other suitable conductive materials.

Referring to FIG. 2M, a support film 700 is attached on the encapsulation material 500', wherein the connection terminal 600 is located on a side of the circuit structures 300 away from the support film 700. In the present embodiment, the connection terminal 600 is formed on the circuit structures 300 first, and then the support film 700 is attached on the encapsulation material 500', but the invention is not limited thereto. In other embodiments, the support film 700 is attached on the encapsulation material 500' first, and then the connection terminal 600 is formed on the circuit structures 300. In some embodiments, a release layer (not shown) is included between the support film 700 and the encapsulation material 500', but the invention is not limited thereto.

Referring to FIG. 2N, the encapsulation material 500' is cut along a plurality of cutting lines CL to form a plurality of encapsulation layers 500 separated from each other, and a plurality of light emitting diode package structures 10 are formed. Each of the light emitting diode package structures 10 includes a corresponding circuit structure 300, a plurality of corresponding light emitting diodes 400, and a corresponding encapsulation layer 500. The cutting lines CL are located between the circuit structures 300. The cutting lines CL are not overlapped with the circuit structures 300. A width W1 of the cutting lines CL is less than a distance W2 between the circuit structures 300.

In the present embodiment, since the cutting process only cuts the encapsulation material 500', damage to the circuit structure 300 during the cutting process may be avoided.

Referring to FIG. 2O, the light emitting diodes 400 on the circuit structures 300 are tested by touching the circuit structures 300 with a probe PB. In the present embodiment, since the connection terminal 600 is located on a side of the circuit structures 300 away from the support film 700, the connection terminal 600 may be touched by the probe PB without removing the support film 700.

Referring to FIG. 2P, at least one of the light emitting diode package structures 10 is removed from the support film 700 and placed on a pixel array substrate 20. In the present embodiment, the pixel array substrate 20 includes a substrate 800, an insulating structure 910, an active element 920, and a connection electrode 930.

The material of the substrate 800 may be glass, quartz, organic polymer, or an opaque/reflective material (such as conductive material, metal, wafer, ceramic, or other suitable materials), or other suitable materials. If a conductive material or a metal is used, then an insulation layer (not shown) is covered on the substrate 800 to avoid a short circuit issue.

The insulating structure 910 may be a single-layer or multi-layer structure. The active element 920 and the connection electrode 930 are disposed in the insulating structure 910. The active element 920 is, for example, a thin film transistor of any form. The connection electrode 930 is electrically connected to the active element 920.

The light emitting diode package structures 10 are connected to the connection electrode 930 of the pixel array substrate 20 via the connection terminal 600.

Referring to FIG. 2Q, a protection layer PL is formed on the pixel array substrate 20, and the protection layer PL covers the encapsulation layers 500 of the light emitting diode package structures 10. At this point, a light emitting device 1 is substantially completed. In the present embodiment, the protection layer PL covers the top surfaces of the light emitting diode package structures 10 and fills the gap between adjacent light emitting diode package structures 10. In some embodiments, the protection layer PL is also filled into the gap between the light emitting diode package structures 10 and the pixel array substrate 20.

Figure 3A:
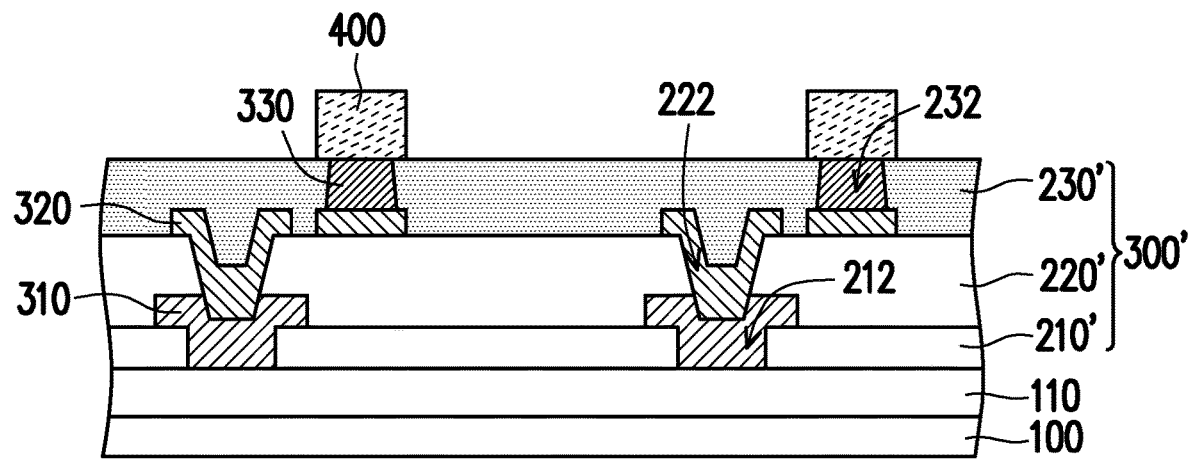
FIG. 3A to FIG. 3B are schematic cross-sectional views of a manufacturing method of a light emitting device according to an embodiment of the invention.
Figure 3B:
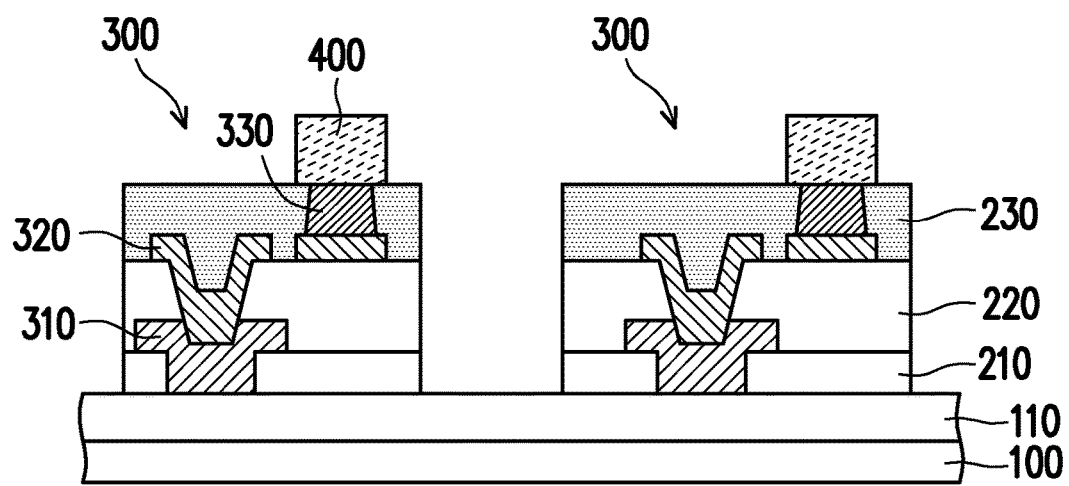

FIG. 3A to FIG. 3B are schematic cross-sectional views of a manufacturing method of a light emitting device according to an embodiment of the invention. Referring to FIG. 3A, a circuit substrate 300' is formed on the carrier board 100. In the present embodiment, the circuit substrate 300' is formed on the release layer 110.

The circuit substrate 300' includes a first insulating material layer 210', a second insulating material layer 220', a light shielding material layer 230', a plurality of first conductive layers 310, a plurality of second conductive layers 320, and a plurality of conductive connecting members 330. The first insulating material layer 210' is entirely formed on the release layer 110, and has a plurality of first vias 212. The first conductive layers 310 are formed on the first insulating material layer 210' and filled into the first vias 212. The second insulating material layer 220' is entirely formed on the first insulating material layer 210' and the first conductive layers 310, and has a plurality of second vias 222. The second conductive layers 320 are formed on the second insulating material layer 220' and filled into the second vias 222. The light shielding material layer 230' is entirely formed on the second insulating material layer 220' and the second conductive layers 320, and has a plurality of third vias 232. The conductive connecting members 330 are formed in the third vias 232.

The light emitting diodes 400 are placed on the circuit substrate 300'. The light emitting diodes 400 are bonded to the conductive connecting members 330.

Referring to FIG. 3B, the circuit substrate 300' is patterned to form the circuit structures 300 separated from each other. In the present embodiment, the method of patterning the circuit substrate 300' includes dry etching, wet etching, or other suitable processes. In the present embodiment, the light emitting diodes 400 are placed on the circuit substrate 300' first, and then the circuit substrate 300' is patterned, but the invention is not limited thereto. In other embodiments, the light emitting diodes 400 are placed on the circuit structures 300 after the circuit substrate 300' is patterned.

After the circuit structures 300 separated from each other and the plurality of light emitting diodes 400 located on the circuit structures 300 are provided on the carrier board 100, the process of FIG. 2I to FIG. 2Q is performed to obtain the light emitting device 1.

Figure 4A:
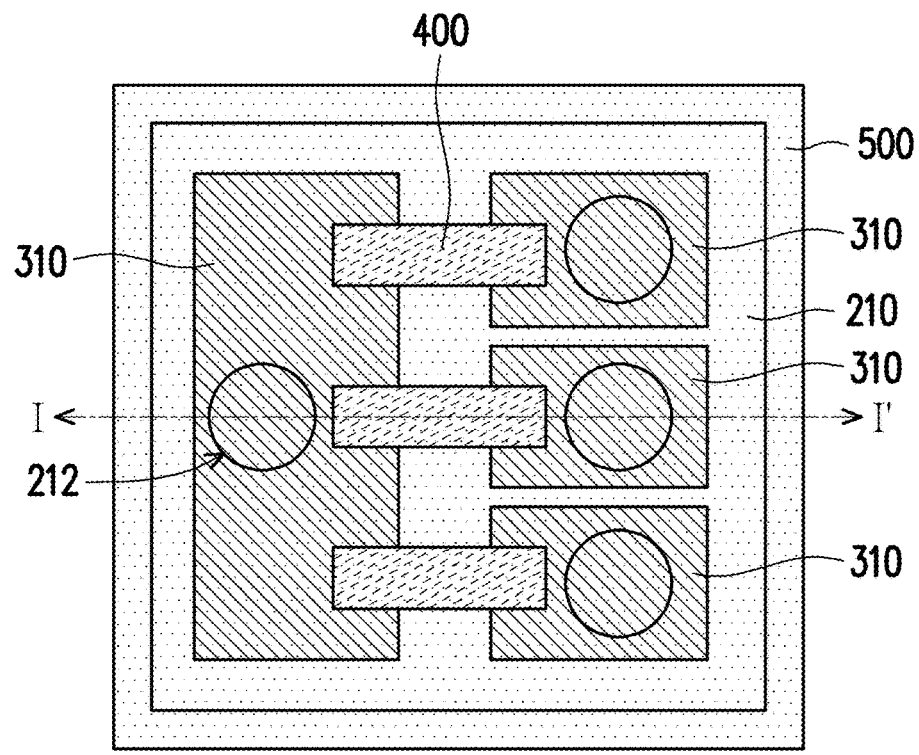
FIG. 4A is a schematic top view of a light emitting diode package structure according to an embodiment of the invention.
Figure 4B:
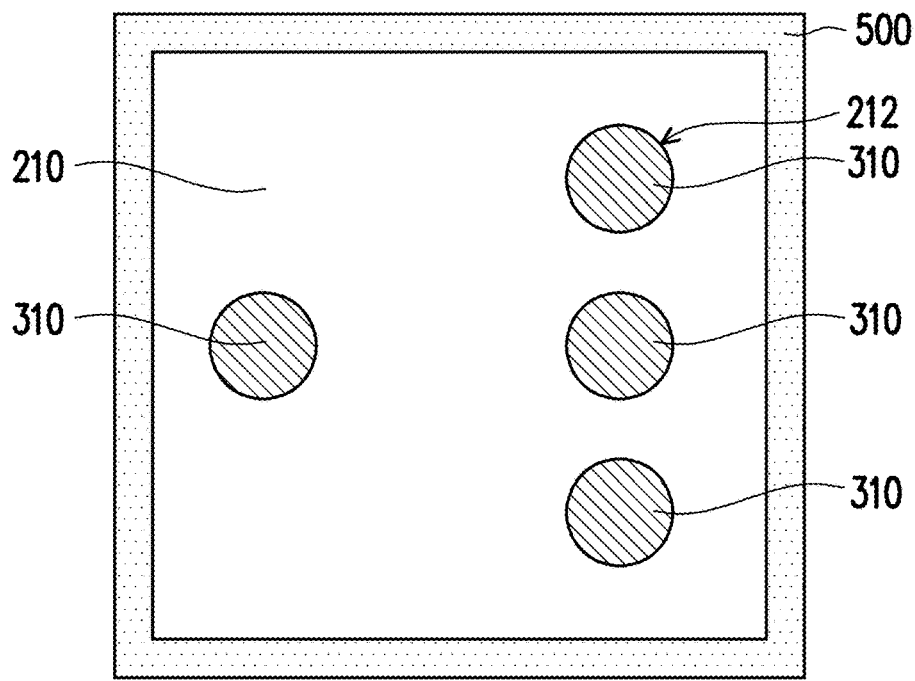
FIG. 4B is a schematic bottom view of the light emitting diode package structure of FIG. 4A.
Figure 4C:
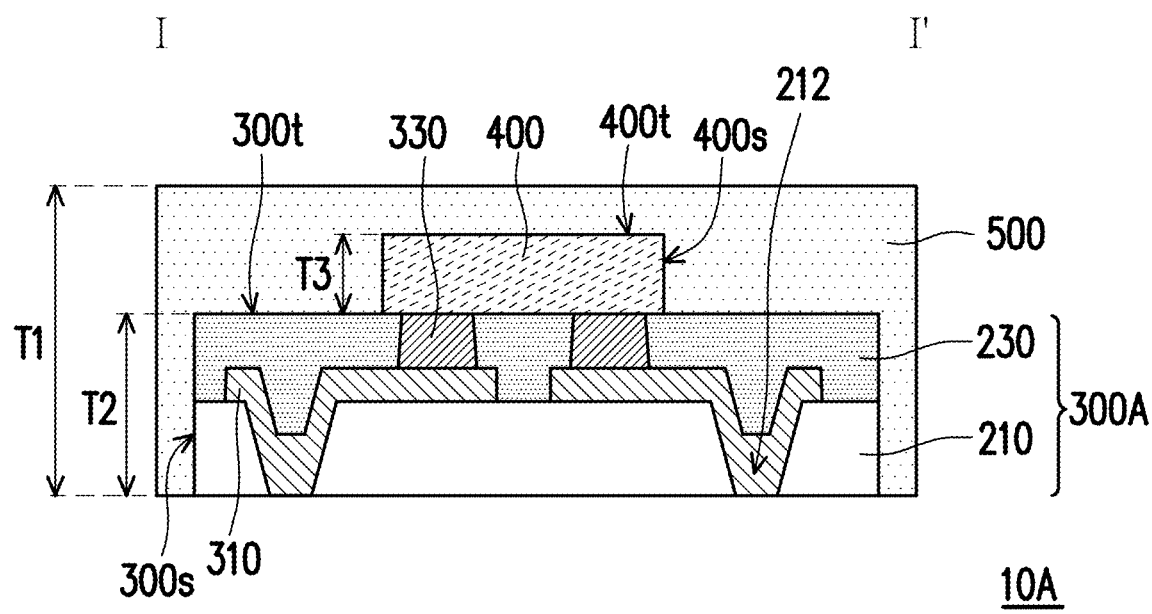
FIG. 4C is a schematic cross-sectional view along line I-I' of FIG. 4A.

FIG. 4A is a schematic top view of a light emitting diode package structure according to an embodiment of the invention. FIG. 4B is a schematic bottom view of the light emitting diode package structure of FIG. 4A. FIG. 4C is a schematic cross-sectional view along line I-I' of FIG. 4A. It should be mentioned here that, the embodiment of FIG. 4A to FIG. 4C adopts the reference numerals of the embodiment of FIG. 1A to FIG. 1C and a portion of the content thereof, wherein the same or similar reference numerals are used to represent the same or similar elements and description of the same technical content is omitted. The omitted portions are as described in the above embodiments and are not repeated herein. For convenience of illustration, the encapsulation layer 500 in FIG. 4A is shown in perspective.

The main difference between a light emitting diode package structure 10A of FIG. 4A to FIG. 4C and the light emitting diode package structure 10 of FIG. 1A to FIG. 1C is: a circuit structure 300A of the light emitting diode package structure 10A does not include the second insulating layer and the second conductive layer.

Please refer to FIG. 4A to FIG. 4C, the circuit structure 300A includes the first insulating layer 210, the light shielding layers 230, and the first conductive layers 310. For convenience of illustration, the light shielding layers 230 are omitted in FIG. 4A.

The first insulating layer 210 has the plurality of first vias 212. The position and quantity of the first vias 212 may be adjusted according to actual needs.

The first conductive layers 310 are located on the first insulating layer 210 and filled into the first vias 212 of the first insulating layer 210. The first conductive layers 310 include a plurality of portions separated from each other, and the plurality of portions are respectively filled into the plurality of first vias 212 of the first insulating layer 210. For example, in the present embodiment, the first insulating layer 210 includes four first vias 212, and the first conductive layers 310 includes four portions separated from each other and respectively filled into the first vias 212. In the present embodiment, the bottom most surface of the first conductive layers 310 filled into the first vias 212 is aligned with the bottom surface of the first insulating layer 210.

The light emitting diodes 400 are disposed on the circuit structure 300A and electrically connected to the circuit structure 300A. In the present embodiment, the light emitting diodes 400 are electrically connected to the first conductive layers 310 via the conductive connecting members 330. In the present embodiment, the light emitting diodes 400 are flip-chip bonded to the circuit structure 300A via the conductive connecting members 330, but the invention is not limited thereto. In other embodiments, the light emitting diodes are vertical light emitting diodes, and after the lower electrode of the light emitting element is bonded to the circuit structure 300A, other conductive lines are additionally formed to electrically connect the upper electrode of the light emitting element to the circuit structure 300A.

In some embodiments, the plurality of light emitting diodes 400 in a single light emitting diode package structure 10A may include light emitting diodes of different colors. Since a single light emitting diode package structure 10A includes the plurality of light emitting diodes 400, transferring one light emitting diode package structure 10A is equivalent to simultaneously transferring the plurality of light emitting diodes 400. In this way, the difficulty of transferring the light emitting diodes 400 is reduced.

The light shielding layers 230 are located on the first insulating layer 210 and surrounds a plurality of contacts between the light emitting diodes 400 and the circuit structure 300A (i.e., the electrodes of the light emitting diodes 400 and/or the conductive connecting members 330). In this way, the plurality of contacts between the light emitting diodes 400 and the circuit structure 300A are protected.

The encapsulation layer 500 covers the top surfaces 400t and the side surfaces 400s of the light emitting diodes 400 and the side surface 300s of the circuit structure 300A. In the present embodiment, the encapsulation layer 500 covers a portion of the top surface 300t of the circuit structure 300A. In the present embodiment, the encapsulation layer 500 covers the first insulating layer 210, the light shielding layers 230, the first conductive layers 310, and the light emitting diodes 400. The encapsulation layer 500 is in contact with the side surface of the first insulating layer 210 and the side surface of the light shielding layers 230.

In the present embodiment, the thickness T1 of the encapsulation layer 500 is greater than the thickness T2 of the circuit structure 300A plus the thickness T3 of the light emitting diodes 400. The encapsulation layer 500 is extended continuously from the top surface of the light emitting diode package structure 10A to the bottom surface of the light emitting diode package structure 10A, and the encapsulation layer 500 covers the side surface 300s of the circuit structure 300A. Therefore, when performing the cutting process, only the position of the encapsulation layer 500 needs to be cut, reducing the probability of damage to the circuit structure 300A during the cutting process.

What is claimed is:

1. A light emitting device, comprising:
   a light emitting diode package structure, comprising:
      a circuit structure, comprising:
         a first insulating layer having a plurality of first vias;
         a first conductive layer filled into the first vias; and
         a light shielding layer located above the first insulating layer and having a plurality of second vias;
      a plurality of conductive connecting members, located in the second vias;
      a plurality of light emitting diodes disposed on the circuit structure;
      an encapsulation layer covering top surfaces and side surfaces of the light emitting diodes and a side surface of the circuit structure, wherein the encapsulation layer physically contacts a side surface of the first insulating layer and a side surface of the light shielding layer; and
      a pixel array substrate, wherein the circuit structure is bonded to the pixel array substrate, and wherein the light emitting diodes are electrically connected to the circuit structure through the conductive connecting members, and are further electrically connected to the pixel array substrate via the circuit structure.

2. The light emitting device of claim 1, further comprising:
   a protection layer located on the pixel array substrate and covering the encapsulation layer.

3. The light emitting device of claim 1, wherein the circuit structure further comprises:
   a second insulating layer located on the first insulating layer and having a plurality of third vias; and
   a second conductive layer located on the second insulating layer and filled into the third vias, and the light emitting diodes are electrically connected to the second conductive layer through the conductive connecting members, and are further electrically connected to the first conductive layer via the second conductive layer.

4. The light emitting device of claim 3, wherein a transmittance of the encapsulation layer is greater than a transmittance of the first insulating layer and a transmittance of the second insulating layer.

5. The light emitting device of claim 3, wherein
   the light shielding layer surrounding the conductive connecting members between the light emitting diodes and the circuit structure.

6. The light emitting device of claim 5, wherein the encapsulation layer covers and is in contact with the side surface of the first insulating layer, a side surface of the second insulating layer, and the side surface of the light shielding layer.

7. The light emitting device of claim 1, wherein a thickness of the encapsulation layer is greater than a thickness of the circuit structure plus a thickness of the light emitting diodes.

8. A manufacturing method of a light emitting device, comprising:
   providing a plurality of circuit structures separated from each other and a plurality of light emitting diodes located on the circuit structures on a carrier board, wherein each of the circuit structures comprises:
      a first insulating layer having a plurality of first vias;
      a first conductive layer filled into the first vias; and
      a light shielding layer located above the first insulating layer, wherein a plurality of conductive connecting members are located in a plurality of second vias of the light shielding layer;
   forming an encapsulation material on the light emitting diodes and the circuit structures, wherein the encapsulation material covers top surfaces and side surfaces of the light emitting diodes and side surfaces of the circuit structures, and the encapsulation material physically contacts a side surface of the first insulating layer of each of the circuit structures and a side surface of the light shielding layer of each of the circuit structures;
   cutting the encapsulation material along a plurality of cutting lines to form a plurality of encapsulation layers separated from each other, and forming a plurality of light emitting diode package structures, wherein each of the light emitting diode package structures comprises a corresponding circuit structure, a plurality of corresponding light emitting diodes, and a corresponding encapsulation layer, and wherein the cutting lines are located between the circuit structures; and
   placing at least one of the light emitting diode package structures on a pixel array substrate, wherein the circuit structure of the at least one of the light emitting diode package structures is bonded to the pixel array substrate, and wherein the light emitting diodes of the at least one of the light emitting diode package structures are electrically connected to the circuit structure through the conductive connecting members, and are further electrically connected to the pixel array substrate via the circuit structure of the at least one of the light emitting diode package structures.

9. The manufacturing method of the light emitting device of claim 8, further comprising:
   and forming a protection layer on the pixel array substrate and covering the corresponding encapsulation layer of the at least one of the light emitting diode package structures.

10. The manufacturing method of the light emitting device of claim 8, further comprising:
attaching a support film on the encapsulation material; and
electrically connecting the circuit structures using a probe to test the light emitting diodes.

11. The manufacturing method of the light emitting device of claim 8, wherein a width of the cutting lines is less than a distance between the circuit structures.

12. The manufacturing method of the light emitting device of claim 8, wherein the cutting lines are not overlapped with the circuit structures.

13. The manufacturing method of the light emitting device of claim 8, wherein a method of providing the circuit structures separated from each other and the light emitting diodes located on the circuit structures on the carrier board comprises:
forming a circuit substrate on the carrier board;
patterning the circuit substrate to form the circuit structures separated from each other; and
placing the light emitting diodes on the circuit substrate before the circuit substrate is patterned or placing the light emitting diodes on the circuit structures after the circuit substrate is patterned.

14. The manufacturing method of the light emitting device of claim 8, wherein a method of providing the circuit structures separated from each other on the carrier board comprises:
forming the first insulating layers separated from each other on the carrier board, wherein each of the first insulating layers has the first vias; and
forming the first conductive layers on the first insulating layers, wherein each of the first conductive layers is filled into a plurality of corresponding first vias.

15. The manufacturing method of the light emitting device of claim 14, wherein a method of providing the circuit structures separated from each other on the carrier board further comprises:
forming a plurality of second insulating layers separated from each other on the first insulating layers, wherein each of the second insulating layers has a plurality of third vias; and
forming a plurality of second conductive layers on the second insulating layers, wherein each of the second conductive layers is filled into a plurality of corresponding third vias.

16. The manufacturing method of the light emitting device of claim 15, wherein the encapsulation material is in contact with side surfaces of the second insulating layers.

* * * * *